US006996265B1

(12) United States Patent
Patnaik

(10) Patent No.: US 6,996,265 B1
(45) Date of Patent: Feb. 7, 2006

(54) INSPECTION METHOD UTILIZING VERTICAL SLICE IMAGING

(75) Inventor: Rohit Patnaik, San Diego, CA (US)

(73) Assignee: Teradyne, Inc., Boston, MA (US)

( * ) Notice: Subject to any disclaimer, the term of this patent is extended or adjusted under 35 U.S.C. 154(b) by 789 days.

(21) Appl. No.: 09/707,709

(22) Filed: Nov. 7, 2000

Related U.S. Application Data

(60) Provisional application No. 60/163,932, filed on Nov. 8, 1999.

(51) Int. Cl.
*G06K 9/00* (2006.01)

(52) U.S. Cl. .......................... 382/149; 378/58; 378/21

(58) Field of Classification Search ................ 382/141, 382/143, 144–151, 199; 348/86, 87, 125, 348/126, 129; 438/16; 702/57, 58, 59; 378/21, 378/22, 23, 58; 356/237.1
See application file for complete search history.

(56) References Cited

U.S. PATENT DOCUMENTS

| | | | | |
|---|---|---|---|---|
| 5,015,956 A | | 5/1991 | Jensen ......................... 324/309 |
| 5,097,492 A | | 3/1992 | Baker et al. ................... 378/22 |
| 5,594,770 A | * | 1/1997 | Bowles et al. ................. 378/58 |
| 5,621,811 A | * | 4/1997 | Roder et al. ................. 382/147 |
| 5,687,209 A | * | 11/1997 | Adams ......................... 378/22 |
| 5,719,952 A | | 2/1998 | Rooks ......................... 382/150 |
| 5,978,440 A | * | 11/1999 | Kang et al. ................... 378/21 |
| 6,314,201 B1 | * | 11/2001 | Roder ......................... 382/147 |
| RE37,899 E | * | 11/2002 | Grodzins et al. ............. 378/86 |
| 6,490,368 B2 | * | 12/2002 | Roder ......................... 382/147 |
| 6,501,822 B2 | * | 12/2002 | Roder ......................... 378/22 |
| 6,665,433 B2 | * | 12/2003 | Roder ......................... 382/147 |

FOREIGN PATENT DOCUMENTS

WO    WO 99/42818    8/1999

* cited by examiner

*Primary Examiner*—Samir Ahmed

(57) ABSTRACT

An inspection method utilizing vertical slice imaging. A number of horizontal slice images, extending through an object of interest, are acquired. A vertical region of interest is defined from the data representing the horizontal slice images. A vertical slice image is constructed based upon the horizontal slice image data falling within the vertical region of interest. The vertical slice image data may be analyzed to detect defects. In addition, a method is provided to detect defects in a BGA joint. The method includes locating a center of the joint. The method may further include measuring a number of diameters through the center of the joint and applying a rule to compare the measured diameters to an expected diameter.

10 Claims, 6 Drawing Sheets

A bga ball showing the pad, ball and fillet

INSPECTION METHOD UTILIZING VERTICAL SLICE IMAGING

RELATED APPLICATIONS

This application claims the benefit of U.S. Provisional Application No. 60/163,932 filed on Nov. 8, 1999.

FIELD OF THE INVENTION

The present invention relates generally to printed circuit board inspection techniques, and more particularly to a method and apparatus for inspecting interconnections on or within circuit boards utilizing vertical slice imaging techniques.

BACKGROUND OF THE INVENTION

Most electronic devices manufactured today include one or more printed circuit boards, which may also be referred to as printed wiring boards. Such printed circuit boards typically provide support for and interconnections among electronic devices and components. A common device found on printed circuit boards is an integrated circuit, which is typically formed from a semiconductor material that is encapsulated in a ceramic or plastic package. The integrated circuit package provides input and output (I/O) pins for mechanically and electrically connecting the integrated circuit semiconductor material to conductive traces on the printed circuit board. With advances in semiconductor technology, the complexities of integrated circuit devices has increased along with improvements in the performance of the devices. In association with the increased complexity of the integrated circuit devices, larger and larger numbers of I/O pins are required.

Electrical interconnections between the integrated circuit device's I/O pins and the printed circuit board are commonly formed by soldering the I/O pins to through holes in the printed circuit board, and increasingly, to conductive pads on the surface of the printed circuit board.

Methods are known for inspecting the electrical interconnections among components, integrated circuit devices and printed circuit boards. For example, optical inspection techniques have been used, both manual and automated, to inspect the placement and connections of components and integrated circuit devices to printed circuit boards. Optical inspection techniques, however, may be incapable of adequately inspecting the interconnection between certain high density integrated circuits and printed circuit boards. For example, such techniques are generally insufficient for inspecting the increasingly common Ball-Grid-Array (BGA) type devices.

In order to inspect high-density boards and BGA-type devices, inspection systems using penetrating radiation are believed to be superior to optical inspection systems. Techniques using penetrating radiation, such as x-ray, can potentially be used to inspect electrical interconnections for a BGA-type device, including both peripheral joints and joints hidden under the integrated circuit package. In order to form an image of joints hidden under the integrated circuit package, the inspection system should be capable of generating a cross sectional horizontal image (also referred to herein as a horizontal "slice" image) at a level that cuts through the I/O pins of the device.

X-ray inspection systems that are capable of generating horizontal slice images are known. For example, U.S. Pat. Nos. 5,097,492 and 5,594,770 describe two alternative approaches to generating a cross sectional horizontal image. The device shown in U.S. Pat. No. 5,097,492 generates a horizontal cross sectional image utilizing the principles of laminography. A disadvantage of this technique, however, is that the resulting horizontal cross sectional image commonly includes blurring artifacts generated by structures outside the plane of interest. Rather than relying on the principles of laminography, U.S. Pat. No. 5,594,770 shows a system that utilizes the principles of tomography with a stationary detector. In accordance with this technique a predetermined number of off-axis transmission images may be acquired and combined to produce a horizontal slice image of a plane of interest.

The theory of tomosynthesis is well documented. Using tomosynthesis, it is possible to create the horizontal slice images through test objects at different focal planes arranged along a vertical axis. Although this technique is advantageous in seeing horizontally through the object under test and determining the quality of, for example, a solder joint, valuable information regarding the correlation among several horizontal slice images may be lost. In particular, valuable defect signature information, such as the signature of voids (air pockets) which may extend across several horizontal slices may be very diluted in a single horizontal slice image, particularly where the horizontal focal plane fails to pass through the center of the void. In case of leaded devices there may be high bridges, i.e. bridges between pins but the bridge occurs at a level higher than the fillet. Since it may not be feasible to check each and every slice, such defects may be missed.

It would therefore be desirable to have an improved method and apparatus for inspecting electrical connections.

SUMMARY OF THE INVENTION

In accordance with a first aspect of the present invention, an inspection method utilizing vertical slice imaging is provided. A number of horizontal slice images, extending through an object of interest, are first acquired. A vertical region of interest is defined from the data representing the horizontal slice images. A vertical slice image is constructed based upon the horizontal slice image data falling within the vertical region of interest.

In accordance with a second aspect of the present invention, a method is provided to detect defects using a vertical slice image. Such defects may include, but are not limited to, open or lifted I/O pins, a tilted device, insufficient or excess solder, voids and bridges.

In accordance with a third aspect of the present invention, a method for inspecting a BGA joint is provided. The method includes measuring, in a slice image, a plurality of diameters through the BGA joint at predetermined angles. A rule is then applied to compare the measured diameters to an expected diameter.

DETAILED DESCRIPTION OF PRESENTLY PREFERRED EMBODIMENTS

In accordance with a preferred embodiment of the present invention, a method and apparatus for inspecting connections utilizing vertical slice information is provided. The theory of tomosynthesis and the practice of tomosynthetic reconstruction is well documented. Using tomosynthesis, it is possible to synthesize horizontal slices across objects at different focal planes. Techniques and apparatii for generating such horizontal slice images are known to those skilled in the art. Reference may be made in this regard to U.S. Pat. Nos. 5,594,770, 5,097,492 and 4,688,241, the contents of each of which are incorporated herein by reference. It is important to note that the terms horizontal slice image and vertical slice image, as used herein, refer to data sets containing information associated with an image, which may or may not be actually displayed.

Figure 1:
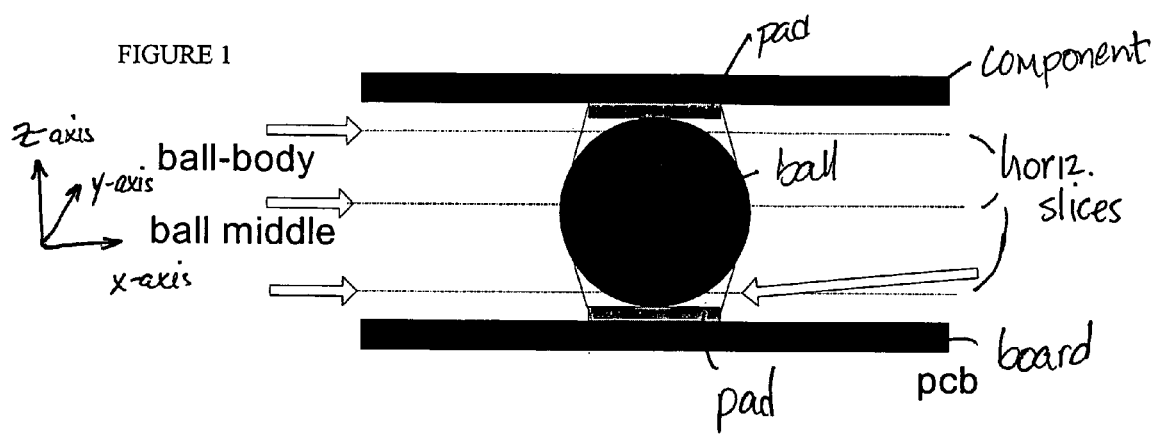
FIG. 1 shows a vertical slice image of a BGA joint and a cartesian coordinate system definition for purposes of the detailed description herein.

FIG. 1 illustrates a BGA joint with a number of horizontal slice image locations along the Z-axis being designated by dashed lines. Although the generation of horizontal slice images is advantageous in "seeing" horizontally through the object and determining the quality of a solder joint, valuable information correlating the information in the various horizontal slices is lost. Valuable defect signature information such as signature of voids (air pockets) which may extend through several horizontal slices, may be significantly diluted in the horizontal slice, depending upon the number of horizontal slice images analyzed and the spacing therebetween. Generally, only a few meaningful slices are analyzed, typically at the pad/component, ball and pad/board levels for example. Voids in the space between horizontal slice images may be missed. However, the signature of a void, for example, is quite strong in the vertical slice as it captures information from several horizontal slices.

Another example is a high bridge between two pins of a leaded device. Since the bridge is not at the level of the pad/component horizontal slice, it is often missed as it is not practical to inspect each and every horizontal slice that may be generated. Since the vertical slice is in effect a combination of all the horizontal slices generated, the high bridge may be detected.

Other valuable signature information, such as non-wetting or tilted components which are difficult to see in 2-D or even horizontal slicing, can be detected using the vertical slicing technique described herein. In accordance with a preferred embodiment, a system that is capable of acquiring data to form a horizontal slice image is utilized to acquire such data. The horizontal slice image data may then be used to generate vertical slice image data, as described below.

Figure 2:
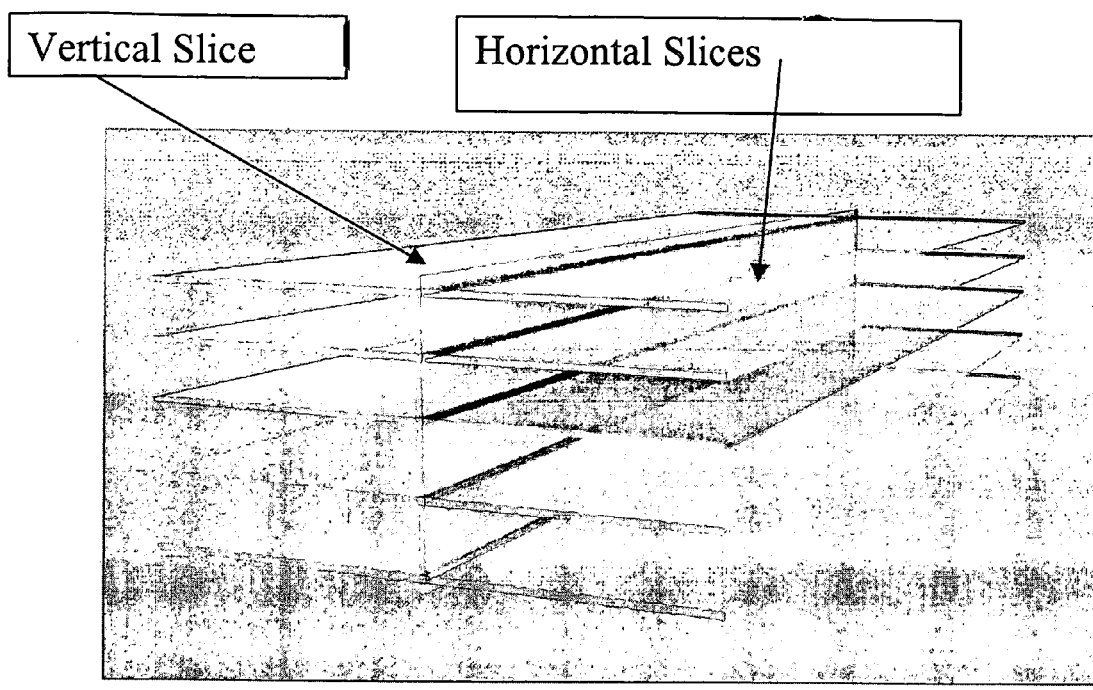
FIG. 2 illustrates the synthesis of a vertical slice image plane from a series of horizontal slice image planes at varying Z-axis locations with respect to the coordinate system defined in FIG. 1.

Because each of the horizontal slice images is constructed at different points along the Z-axis, but at the same points along the X-axis and Y-axis, it is therefore possible to reconstruct a vertical slice without having to register the horizontal slices in X and Y. FIG. 2 illustrates the synthesis of a vertical slice from a number of horizontal slices.

Figure 8:
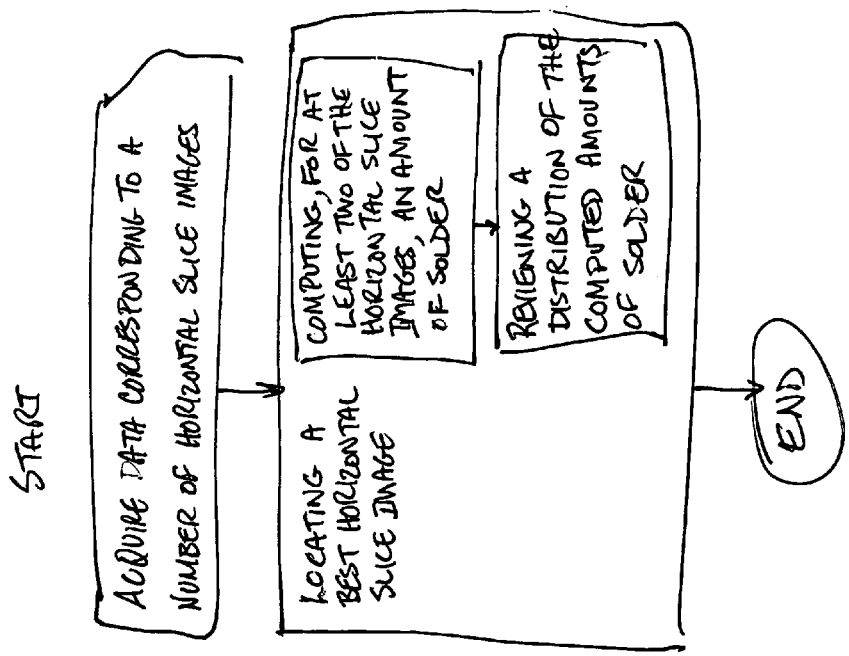
FIG. 8 is a generalized flow diagram illustrating a preferred method for inspecting a joint.

In the Z-axis direction, a preferred embodiment first endeavors to locate the "best" horizontal slice image for the connection(s) being inspected. A software-based technique, referred to herein as the Zfind method, is preferably used for this purpose. In general, the Zfind method has two distinct preferred applications. First, it may be used to identify the best horizontal slice for synthesizing a vertical slice. Second, it may be used to identify the best horizontal slice for analyzing defects in solder connections, BGA joints, electrical components and the like. FIG. 8 is a generalized flow diagram illustrating a preferred method for inspecting a joint, such as for example a BGA joint, that includes the step of locating the best horizontal slice. Further details in regard to the Zfind method are provided below.

For the vertical slice application, the Zfind method is first used to come up with the most optimal Z-axis location for synthesizing a vertical slice image to inspect the joint(s). Then, keeping the Z-position resulting from the Zfind method at the center of the expected vertical slice, several horizontal slices above and below the best slice are then used to create the vertical slice. A vertical slice is synthesized by combining a corresponding row of pixels from each horizontal slice, stacked on top of each other. This may provide the vertical cross-section of, for example, the row of joints of a device at a particular location specified by (X,Y). Different vertical slices may need to be generated at different Y-axis locations (holding X constant) or at different X-axis locations (holding Y constant), depending on the orientation of the desired vertical slice image. The best vertical slice may be determined using the software-based technique referred to and described below as the XYfind method.

Figure 3:
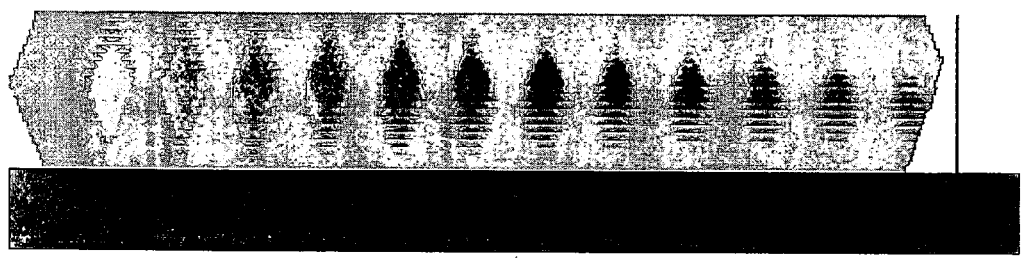
FIG. 3 is an example of a vertical slice image showing a tilted BGA device.

Several algorithms are provided herein that detect defects based upon their signature in the vertical cross sectional image. FIG. 3 illustrates an example of vertical slice image of a tilted BGA device. The orientation of the device may be automatically inspected, using an automated defect recognition system such as the Mv-6000 from Nicolet Imaging Systems of San Diego, Calif., by analyzing the vertical slice image for defect signatures. Examples of such analytical tools are set forth below.

Zfind: Method to find the horizontal slice in the focal plane

After a series of slices are made, the question of choosing the right slice becomes important as the slice at the proper focal plane or Z-axis location needs to be examined for defects. As noted above, not only may Zfind be used to identify the best horizontal slice for synthesizing a vertical slice, but also Zfind may be used to identify the best horizontal slice for analyzing defects.

The method of Zfind is to selectively but automatically segment the region of interest and use the information to compute a solder amount defined as below:

$$\sum_{gray=0}^{bgd\_gray} (\text{background\_gray} - \text{gray}) * \text{histogram}[\text{gray}]$$

The summation is computed for each of the horizontal slice images. The selection of the slice elevations must be done in accordance with the sampling theorem (rate of sampling <=2*freq. of. change). The summation values are signature values for the slices. These signature values are then searched to find a specific pattern to detect the "best" slice. Because the region of interest may be difficult to locate precisely, for example due to warpage, horizontal slice images are preferably synthesized at various levels above, below and through the anticipated region of interest. The desired horizontal slice image for the particular region of interest may then be identified using the Zfind method described herein. The desired horizontal slice image may be referred to herein as the "best" slice. Thus, the "best slice" is not intended to refer to a qualitative comparison of the various horizontal slice images, but rather refers to the horizontal slice image that is located at the desired Z-axis position for analyzing the region of interest.

For example, in a case where the region of interest is of BGA joint, the horizontal slice passing through the center of the ball may be identified by reviewing the distribution of summation values for the synthesized horizontal slice images. Specifically, the signature value in this case typically corresponds to the first significant peak in the summation distribution after filtering out the noise. This slice could be used to run algorithms for analysis. A better quality slice could be obtained the following way. After the most significant peak is determined, a least squares quadratic fit is used to fit this peak and to the next point below and the next point above the peak. The derivative of the fitted equation is set to zero to find the maximum or most optimal elevation. Another slice, at the most optimal elevation computed above, is generated from the same initial set of off-axis images. This is the slice that the algorithms can process in order to analyze the signature of the joints and find defects. Other signature values for other types of regions of interest will become apparent to those skilled in the art, upon reviewing this detailed description.

Alternatively, the distribution of the summation values may be searched to find the location in Z where the solder amount in the region of interest, as computed above, falls below the noise level. This location in Z would generally correspond to the level of the pad/lead interface.

To increase the chance for success in identifying the best slice, some unobstructed anchor devices are preferably identified. The unobstructed anchors allow the range of search to be restricted, thereby improving accuracy and speed.

Vertical Slicing

The process of constructing a vertical slice, v, from the given horizontal slices u1,u2,u3 . . . un is as follows. The horizontal slice u1,u2, . . . , un is defined as $$u[i] = \begin{matrix} ui[0][0] & ui[0][1] & ui[0][2] & \ldots & ui[0][n] \\ ui[1][0] & ui[1][1] & ui[1][2] & \ldots & ui[1][n] \\ \ldots & \ldots & \ldots & & \ldots \\ ui[m][0] & ui[m][1] & ui[m][2] & \ldots & ui[m][n] \end{matrix}$$

Where i=number of the slice, and m,n are rows and columns in each horizontal slice. The vertical slice, v, may then be defined is as follows:

$$\begin{matrix} u1[0][0] & u1[0][1] & u1[0][2] & \ldots & u1[0][n] \\ u2[0][0] & u2[0][1] & u2[0][2] & \ldots & u2[0][n] \\ \ldots & \ldots & \ldots & & \ldots \\ uz[0][0] & uz[0][1] & uz[0][2] & \ldots & uz[0][n] \end{matrix}$$

Where z is the number of horizontal slices, and u1[0][0], u[2][0][0], u3[0][0], . . . , uz[0][0] are corresponding pixels from all the slices.

Figure 7:
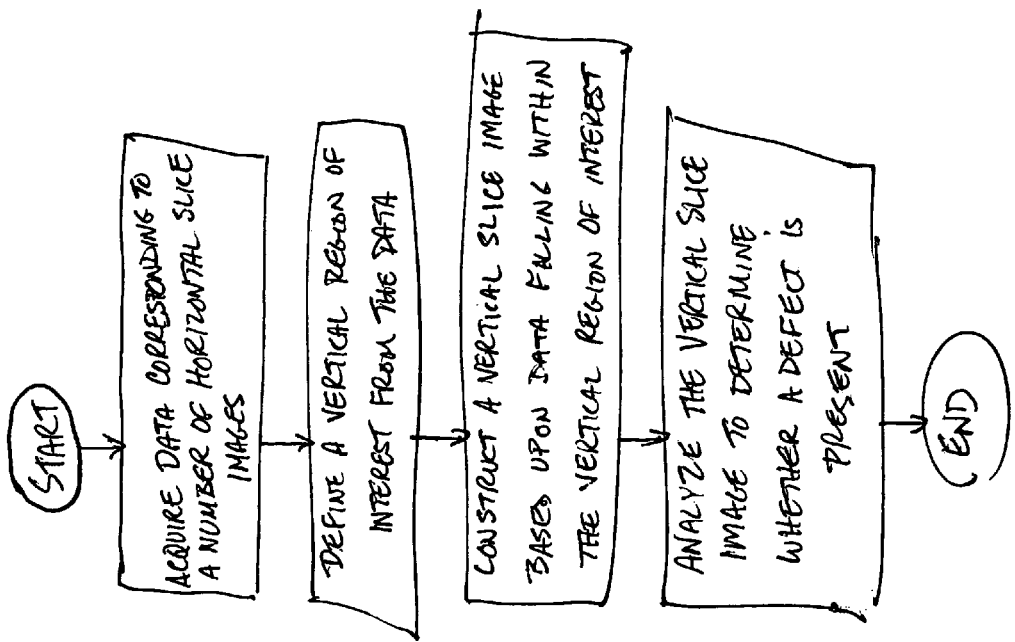
FIG. 7 is a generalized flow diagram illustrating a preferred inspection method utilizing vertical slice imaging.

Once the vertical slice information is synthesized, it may be analyzed to detect defects. FIG. 7 is a generalized flow diagram illustrating a preferred inspection method utilizing vertical slice imaging. With respect to the step of analyzing the vertical slice image, several preferred methods, which may be used on a BGA joint for example, to detect defects based upon their signature in a vertical slice are set forth below.

1. Open or Lifted Ball/Lead

Figure 4:
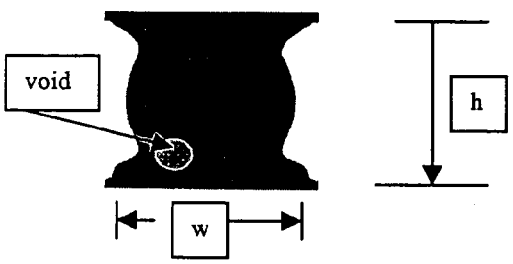
FIG. 4 illustrates two vertical slice images of a BGA joint, one image showing a lifted ball and one image showing a void.
Figure 4:

Referring now to FIG. 4, a measurement of the height (h) of the ball in a BGA joint may be used to determine whether the ball is open or lifted. One preferred method proceeds as follows. A rectangular window is placed vertically across the vertical slice of a joint. A profile of the joint in the region of interest is determined. This data in each of the columns in a row is averaged to give a point in a final profile vector, P. This is done for all the rows of the profile. The final vector is then used to compute a difference vector, which is as follows diff_vector=p[I]−p[I+2] for I=0,N, where $N$ is the number of rows of the profile.

The difference in positions of the maximum and the minimum will give the height in pixels. The measured height may be compared to a threshold to make a qualitative assessment of the joint. The position of each of the leads could be computed by calculating the mid-point between the maximum and minimum positions. Comparing the relative positions of the midpoints will indicate defective pins.

2. Improper Fillet

A measurement of width (w) at different heights of the lead and fillet may be taken to determine if the fillet is formed properly. This may be measured by placing rectangular window across the vertical slice of a solder joint and measuring its width at that location. This is then preferably repeated at several points along the Z-axis including those corresponding to the pads, the fillet and the middle of the ball. The maximum and minimum widths would indicate whether the joint has defects, e.g. lack of fillet at the edge of the ball would yield a smaller width.

3. Voids

The location of a void and its measurement are well coordinated. The void is easily located in a vertical slice and its size in amount of pixels measured. A method for detecting voids is as follows. The void area is first segmented. Segmentation, as used herein, refers to splitting a region of interest into segments or areas such that each holds some property distinct from its neighbor. In this case, the area of the void shows up much lighter in the image than the background, which is solder and/or the ball. The void areas need to be identified to be within a gray intensity range. The segmented area is then checked for connectivity as follows. All pixels surrounding the pixel in question are connected. A set of pixels in a region is said to be connected if each pixel is connected to all other pixels in that region. By connected we mean that in a region S, a pixel p and a pixel q are connected if there exists a path from p to q and both p and q belong to the set of pixels in region S. In some cases we may find several voids. Each of these voids are isolated and their size computed for analysis. The region around the joint sometimes may be segmented as well along with the void. This region around the joint will need to be discarded as this by itself is not a void.

4. Titled Device

A tilted device can be easily measured by locating in the vertical slice the pins at opposite ends of the device (or any or all intermediate pins) and computing the angle between them, either by simple trigonometry or by regression.

A preferred method for identifying a tilted device is as follows. A locator as defined in the numbered paragraph 2 above is used to locate the center of the joint. Once the center of all the joints of interest are located, the values are provided as the z-location along with the x and y locations obtained by the same locator as above, to a linear equation, such as below:

z[I]=a*x[I]+b*y[I]+c, where

I=joint number 1,N;

a,b,c are coefficients that will be determined from the data; and x[I],y[I],z[I] is the location in X,Y,Z of the joint.

Computing (dz/dx) and (dz/dy) provides a measure of the tilt of the device.

Figure 5:
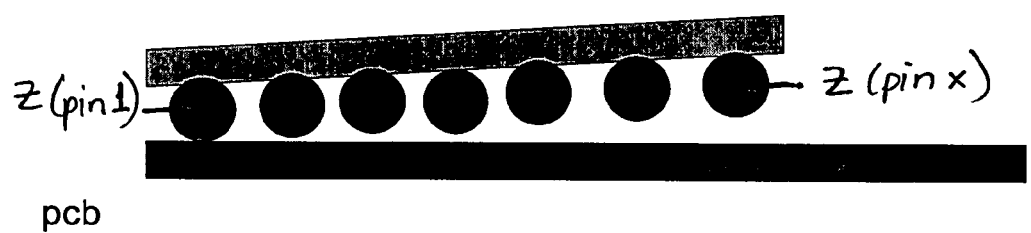
FIG. 5 shows a tilted component having a number of I/O pins, each of which is located at a different location along the Z-axis.

FIG. 3 illustrates a vertical slice image of a tilted BGA device and FIG. 5 illustrates an alternative method of analyzing the vertical slice image data. As shown in FIG. 5, a tilted device may be identified by locating the centers of balls at opposing ends of the BGA device and comparing the Z-axis locations of the ball centers.

5. Bridges

Locations of bridges at different levels between two joints can be effectively recognized in a vertical slice. This type of defect may be missed if one were looking only at some of the horizontal slices to try to make an effective determination of the presence or absence of a bridge. A preferred method is as follows: A rectangular window about the size of the height of the vertical slice and the pitch in width is placed between the joints. The area is segmented to isolate the bridge. The number of segmented pixels in all the rows of each column are counted. If all the columns have positive (>0) counts then the two joints are regarded as bridged.

6. Insufficient/Excess Solder

An amount of solder may be computed at different levels in the lead/fillet to determine the quality of the fillet. This may help determine insufficient fillets. A preferred method is as follows: A rectangular window is placed across the joint at three locations—the pad, the fillet and the ball. The region of interest is extracted. The amount of solder is computed as follows:

$$\sum_{i=1}^{bagd\_gray} (background\_gray - i) * h[i]$$

where i is the intensity of the pixel and h is the histogram of the pixel.

Additional BGA Measurement Techniques

Figure 9:
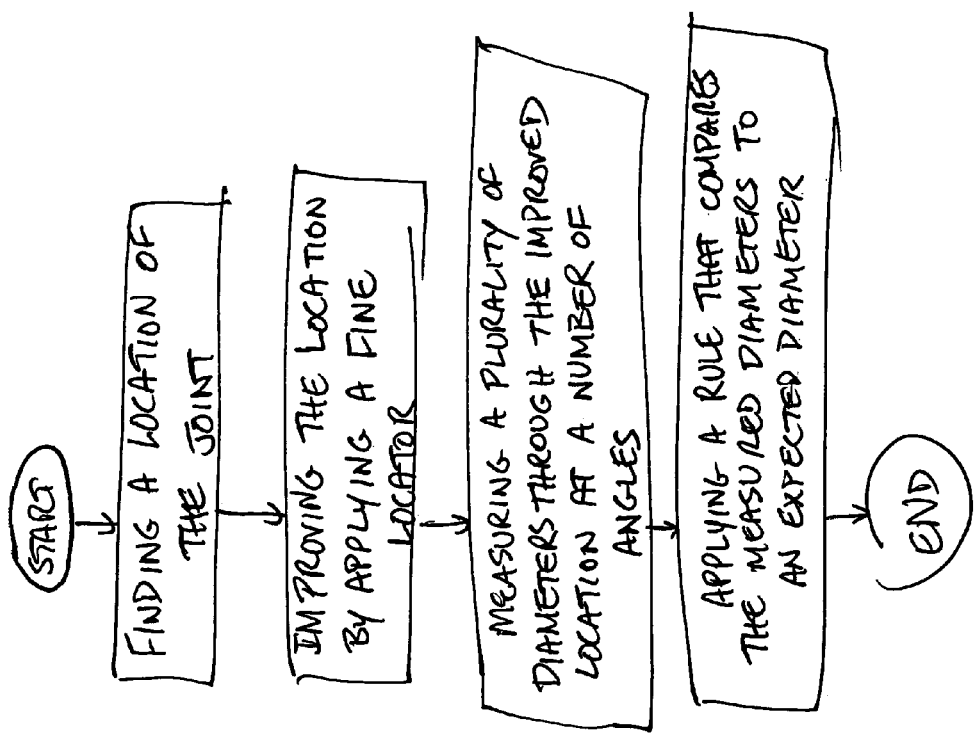
FIG. 9 is a flow diagram illustrating a preferred method for inspecting a BGA joint.

With the increased popularity of BGA and FCA type circular components, there is also a growing concern for automated inspection of these grid arrays. One of the discerning characteristics of the BGAs or FCA's has been its round shape. A well-formed BGA joint is circular. Therefore, the deviation of the BGA or FCA joint from an expected circle will tend to indicate the wellness of the joint. FIG. 9 is a flow diagram illustrating a preferred method for inspecting a BGA joint. The following describes the preferred method for assessing the quality of such a joint:

1. The BGA joint is located by any centroid-based rough locator. This location would be good starting point for the step 2 below. The pixels representing the BGA ball are segmented or separated from the background scene (in this case for example a circuit board) and clutter or noise.

The x-locations of all the segmented pixels are then summed and divided by N (N being total number of segmented pixels):

$$\sum_{i=1}^{N} X[i])/N$$

The y-locations of all the segmented pixels are then summed and divided by N (N being total number of segmented pixels):

$$\sum_{i=1}^{N} Y[i])/N$$

This XY-location of the joint may not be good enough, because void or other artifacts in the image may cause substantial deviation from the actual center of the object. A fine locator is then required to get a better location.

2. A fine locator is used to better the location found in paragraph 1. This location has to be good in spite of noise or clutter in the image or voids in the ball. A preferred fine locator is set forth in BGARefine, which is set forth below in Software Appendix 1.

Figure 6:
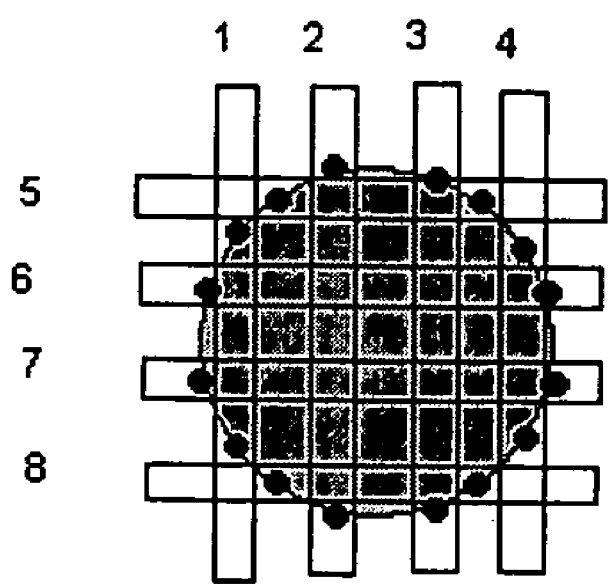
FIG. 6 is a cross sectional image of a BGA joint illustrating a placement of 8 locator windows, each of which includes two ball edges from the BGA joint.

As illustrated in FIG. 6, locator windows are positioned by taking into account the located joint center. The locator window offsets are computed based upon the diameter of the ball. The ball edges are located using rectangular locator windows at 4 locations along the X-axis passing through the center of the ball and 4 locations across the Y-axis passing through the center of the ball. At each of the 8 locations, the ball edge is detected by using a five point derivative edge finder on either side of the ball as in FIG. 6 and the center determined as the midpoint of the two locations.

The x-locations from windows 5,6,7, and 8 are averaged to give the new x location. The y locations from windows 1,2,3, and 4 are averaged to give the new y location. The new x,y is the center of the ball.

The 5-point derivative is defined as below—

All the pixels in one of the windows above are extracted. In the case of a window in the x-direction, a column profile is found by averaging all the pixels in all the rows for any particular column. This is done for all the columns to give a profile. A 5-point derivative is then applied to the entire profile as follows:

Out [I]=2*(P[I+4]−P[I])+(P[I+3]−P[I+1]) for (I=1, size of profile)

3. Once the joint is accurately located, the diameter of the BGA is measured at 4 or more distinct angles. As the number of angles used is increased, computation time increases, but the accuracy of the qualitative determination likewise increases. The measured diameters are noted. The actual diameter of the ball is provided. The deviation of the measured diameters from the expected diameters is measured by a sum of the squares of the deviations. In other words the deviation is $$\sum_{i=1}^{N} (D - d[i])^2$$

Where D=expected diameter of each ball
  d[i]=measured diameters for (i=1, N)
  N=number of diameter measurements.

The value obtained above is the sum of the square of the errors due to deviation of the fillet shape from the expected ideal case. The smaller the sum, the better the joint. "Good" BGA fillets will have a value close to 0, while "bad" ones will have large values. The actual separation may be determined statistically from the distribution of the data in regard to "good" and "bad" joints. For purposes of providing additional detail with respect to a presently preferred embodiment, an embodiment of a software-based solution for this solder quality determination is provide in Software Appendix 2, below.

In accordance with a preferred embodiment of the present invention, this method for determining the quality of a BGA joint is applied to data from a synthesized horizontal slice image. Alternatively, the method may be applied to an actual slice image that is generated using a penetrating radiation technique, such as laminography.

XYfind: Method to find the right vertical slice

As noted above, tomosynthesis may be utilized to synthesize horizontal slice images across objects at different focal planes. From these data included in the horizontal slice images, different vertical slice images may be generated in a region of interest by shifting the location along the x-axis or along the y-axis. A preferred technique for finding the correct location at which to make the vertical slice is addressed by the following method.

The method of XYfind is to selectively but automatically segment the area of the joint and to use the information to compute a solder amount defined as below:

$$\sum_{gray=0}^{bkgnd\_gray} (background\_gray - gray) * histogram[gray]$$

The summation values are computed for each of the vertical slice images. The sampling of the slices must be done in accordance with the sampling theorem (rate of sampling <=2*freq. of. change). The summation values are signature values for the slices. These signature values are then searched to find a specific pattern to detect the best slice. The first significant maximum is the approximate location of the most optimal slice. The signature values of this slice and its position in Z is taken along with values and position of one slice above and one slice below the significant maximum. Using the method of least squares fit, a quadratic equation model is fit to the data and its maximum is determined by setting the derivative to zero. The search range for the most optimal X (or Y) is defined by lead width or ball diameter and pitch of the device. This is the range for search on either side of the joint or the row of joints in question. To increase the chances for success in identifying the best slice image, some unobstructed anchor devices are preferably identified. The unobstructed anchors allow the range of search to be restricted, which improves accuracy and the speed of the inspection.

While the invention has been described above in connection with certain embodiments, it should be understood that the invention is not limited to these particular embodiments. Rather, it is intended to cover all alternatives, modifications and equivalents falling within the spirit and scope of invention, as described by the following claims.

---

Software Appendix 1:

```
#define TEMPLATE_SIZE 5
#define NUM_WIN 5
#define NUM_EDGE_TYPE 2
extern roi_t *imgroip;
void
BGARefine(jitype *jip)
{
    /* Structures */
    roi_t      *roi;
    roi_t      *tmproi;
    profile_t  p;
    profile_t  delta_grays;
    /*****Local variables *********/
    int gray;
    int xloc=0, yloc=0;
    int x_roi, y_roi;
    int win_w=0 win_h=0;
    int ball_diam = 0, total_area=0;
    int templocX, templocY = 0;
    int scr_x=0, scr _y=0;
    int left_scr_x=0, left scr_y=0;
    int right scr_x=0, right scr_y=0;
    int i=0, orient=0;
    int correction=0,win_offset=0;
    int save_templocX, save_templocY=0;
    int left_delta, right delta;
    int left_index=0;
    int left_gray=0;
    int right_index=0;
    int right_gray=0;
    int ball_width=0, bump width=0;
    int xcenter[NUM_WIN];
    int ycenter[NUM_WIN];
    int diag         = READPAR(diag_BGARefine);
    int drop_percent = READPAR(BGARefine_edge_drop_percent[JTYPE( )]);
    int p_bump_diameter = PARPIXELS(ball_diameter[JTYPE( )]);
    int p_pad_pitch = PARPIXELS(pad_spacing[JTYPE( )]);
    int penumbra_width = PARPIXELS(penumbra_width[JTYPE( )]);
    int win_dy    = PARPIXELS(BGARefine_win_dy[JTYPE( )]);
    int win_dx    = PARPIXELS(BGARefine_win_dx[JTYPE( )]);
    int win_dw    = PARPIXELS(BGARefine_win_dw[JTYPE( )]);
    int win_dh    = PARPIXELS(BGARefine_win_dh[JTYPE( )]);
#ifdef_OAI_
    int x_scr =GETXSCREEN(RoiGetMil2Pix(imgroip))+
GETBB1NT(i1st_delta_x, JNUM( ));
    int y_scr =GETYSCREEN(RoiGetMil2Pix(imgroip))+
GETBBINT(i1st_delta_y, JNUM( ));
#else
    int x_scr = XSCREEN( ) + OffsetGetX(offset);
    int y_scr = YSCREEN( ) + OffsetGetY(offset);
#endif
    templocX = x_scr;
    templocY = y_scr;
/* size windows and other parameters*/
    ball_diam = p_bump_diameter + 2 * penumbra_width;
    win_w = IABS(2*p_pad_pitch-3*p_bump_diameter/2);
    win_h = (ball_diam)/4;
    win_offset = ball diam/NUM_WIN;
    win_offset = MAX(1, win_offset);
    RoiCenterShift(win_dx win_dy, &templocX, &templocY,
        ORIEN( ));
```

-continued

```
        save_templocX = templocX;
        save_templocY = templocY;
        win_w = win_w + win_dw;
        win_h = win_h + win_dh;
        for (orient=0; orient <= 90; orient += 90)
        {
            templocX = save_templocX;
            templocY = save_templocY;
            RoiCenterShift( 0, -ball_diam/2, &templocX, &templocY,
            orient);
            for (i=0; i<NUM_WIN; i++)
            {
                RoiCenterShift( 0 win_offset, &templocX,
    &templocY, orient);
                RoiCreate(imgroip,templocX,templocY, win_w,
    win_h, orient,&roi);
                /* Save the initial joint location in roi coordinates */
                RoiViewToRoi(roi,templocX,templocY,&x_roi,
    &y_roi);
                DiagDisplayRoi(roi, diag);
                DiagWindowBlink(roi, OVER_GREEN, diag);
                RoiColAvg(roi, &p, diag);
                ProfDeltaGray(&p, &delta_grays,
    STD_SLOPE_DELTA, diag);
                /* Locate the outer edge of the ball */
                ProfMin(&delta_grays, 0, delta_grays.size/2,
    &left_index,
                    &left_delta, diag);
                ProfMax(&delta_grays, delta_grays.size/2,
    delta_grays.size-1,
                    &right_index, &right_delta, diag);
                if (READPAR(diags_on))
                {
                    correction = STD_SLOPE_DELTA/2;
                    /* convert to screen coordinates and display the
    location*/
                    RoiToView(roi, left_index+correction, y_roi,
    &left_scr_x, &left_scr_y);
                    DiagDisplayDots(left_scr_x, left_scr_y,
    OVER_GREEN, diag);
                    /* convert to screen coordinates and display the
    location*/
                    RoiToView(roi, right_index+correction, y_roi,
    &right_scr_x, &right_scr_y);
                    DiagDisplayDots(right_scr_x, right_scr_y,
    OVER_GREEN, diag);
                    if (DiagPrintText(diag))
                    {
                        fprintf(stderr,"Left (Green Dot)Edge found @
    x=%d y=%d n",
                                left_scr_x, left_scr_y);
                        fprintf(stderr,"Right (Green Dot)Edge found @
    x=%d y=%d n",
                                right_scr_x,
    right_scr_y);
                    }
                }
                if (orient == 90)
                    xcenter[i] = left_scr_x+right_scr_x;
                else
                    ycenter[i] = left_scr_y+right_scr_y;
            RoiDestroy(roi);
            }/*for loop for num of window*/
        }/*loop for orient*/
        for (i=0; i<NUM_WIN; i++)
        {
            xloc += xcenter[i];
            yloc += ycenter[i];
        }
        xloc = (5 + (10*xloc)/(2*NUM_WIN))/10;
        yloc = (5 + (10*yloc)/(2*NUM_WIN))/10;
    }
Software Appendix 2:

templocX = x_scr;
    templocY = y_scr;
    /* size windows and other parameters*/
    ball_diam = p_bump_diameter + 2 * penumbra_width;
    win_w = IABS(2*p_pad_pitch-3*p_bump_diameter/2);
```

-continued

```
    win_h = (ball_diam)/4;
    RoiCenterShift(win_dx_win_dy, &templocX, &templocY,
ORIEN( ));
    for (orient=0,i=0; i<NUM_ORIENT; i++,orient+=45)
    {
        RoiCreate(imgroip,templocX,templocY,(win_w+win_dw),
(win_h+win_dh),orient, &roi);
        RoiColAvg(roi, &p, diag);
        ProfDeltaGray(&p, &delta_grays STD_SLOPE_DELTA,
diag);
        ProfMin(&delta_grays, 0 delta_grays.size/2
&left_min_slope_index, &left_min_slope, diag);
        ProfScanFirstAbove(&delta_grays, left_min_slope_index,
delta_grays.size/2, 0, &left_bot_edge, diag);
        ProfMax(&delta_grays, delta_grays.size/2, delta_grays.size-1,
&right_max_slope_index, &right_max_slope, diag);
        ProfScanFirstBelow(&delta_grays, right_max_slope_index,
delta_grays.size/2, 0, &right_bot_edge, diag);
        /* Locate the outer edge of the ball on the left side of the
window*/
        ProfMin(&p, 0, p.size/2 &left_min_index &left_min_gray,
diag);
        ProfMax(&p, 0, p.size/2 &left_max_index &left_max_gray,
diag);
        ToolDropThresh(left_max_gray, left_min_gray,
ball_drop_percent, &left_ball_thresh gray, diag);
        ProfScanFirstAbove(&p, p.size/2 0, left_ball_thresh_gray,
&left_ball_edge_loc, diag);
        /* Locate the outer edge of the ball on the right side of the
window*/
        ProfMin(&p, p.size-1, p.size/2, &right_min_index
&right_min_gray, diag);
        ProfMax(&p, p.size-1, p.size/2, &right_max_index
&right_max_gray, diag);
        ToolDropThresh(right_max_gray, right_min_gray,
ball_drop_percent, &right_ball_thresh_gray, diag);
        ProfScanFirstAbove(&p,p.size/2,p.size-
1,right_ball_thresh_gray,&right_ball_edge_loc,diag);
        /* locate the left edge of the ring*/
        ToolDropThresh(left_max_gray, left_min_gray,
ring_drop_percent, &left_ring_thresh_gray, diag);
        ProfScanFirstAbove(&p, p.size/2, 0,
left_ring_thresh_gray,&left_ring_edge_loc,diag);
        /* locate the right ring edge of the ball*/
        ToolDropThresh(right_max_gray, right_min_gray,
ring_drop_percent,
                                            &right_ring_thresh_gray,
                                            diag);
        ProfScanFirstAbove(&p, p.size/2, p.size-1,
                                            right_ring_thresh_gray,
                                            &right_ring_edge_loc,
                                            diag);
        inner_ball_width[i] = IABS(left_ball_edge_loc-
right_ball_edge_loc);
        outer_ball_width[i] = IABS(left_ring_edge_loc-
right_ring_edge_loc);
        bump_width[i] = ((float)outer_ball_width[i] *
PIXEL2MIL( ));
        ball_width[i] = ((float)outer_ball_width[i] * PIXEL2MIL( ));
        RoiDestroy(roi);
    }/*for loop for diff orientations*/
```

I claim:

1. A tomosynthesis based inspection method comprising the steps of:
acquiring tomosynthesis image data corresponding to a number of horizontal slice images extending through an object of interest;
defining a vertical region of interest from the tomosynthesis image data;
constructing a vertical slice image using the tomosynthesis image data associated with the vertical region of interest, the vertical slice image extending through the object of interest in an orientation generally orthogonal to the horizontal slice images; and analyzing the vertical slice image to identify a vertical slice image signature.

2. The inspection method of claim 1 further comprising the step of analyzing the vertical slice image signature to detect defects in the object of interest.

3. The inspection method of claim 1 wherein the step of defining a vertical region of interest further comprises:
   determining a signature value for the horizontal slice images; and
   analyzing the signature value of the horizontal slice images to identify the best horizontal slice image extending through the object of interest.

4. The inspection method of claim 3 wherein the step of constructing a vertical slice image further comprises:
   identifying tomosynthesis image data corresponding to the best horizontal slice image and horizontal slice images above and below the best horizontal slice image; and
   combining corresponding pixels from the tomosynthesis image data of the best horizontal slice image and horizontal slice images above and below the best horizontal slice image to synthesize the vertical slice image.

5. The inspection method of claim 1 wherein the step of constructing the vertical slice image using the tomosynthesis image data further comprises:
   synthesizing multiple images extending rough the object of interest in an orientation generally orthogonal to the horizontal slice images;
   determining an image signature for each of the multiple images; and
   selecting the vertical slice image from the multiple images based on the image signature of the multiple images.

6. The inspection method of claim 2 wherein the step of analyzing the image signature to detect defects in the object of interest further comprises determining whether a defect exists in a solder fillet.

7. The inspection method of claim 2 wherein the step of analyzing the image signature to detect defects in the object of interest further comprises determining whether a void is present.

8. The inspection method of claim 2 wherein the step of analyzing the image signature to detect defects in the object of interest further comprises determining whether a bridge is present.

9. The inspection method of claim 2 wherein the step of analyzing the image signature to detect defects in the object of interest further comprises determining whether a device is tilted.

10. The inspection method of claim 2 wherein the step of analyzing the image signature to detect defects in the object of interest further comprises determining whether an insufficient amount of solder is present.

* * * * *